US012604576B2

(12) United States Patent
Chien

(10) Patent No.: US 12,604,576 B2
(45) Date of Patent: Apr. 14, 2026

(54) DISPLAY APPARATUS

(71) Applicant: AUO Corporation, Hsinchu (TW)

(72) Inventor: Chih-Wei Chien, Hsinchu (TW)

(73) Assignee: AUO Corporation, Hsinchu (TW)

( * ) Notice: Subject to any disclaimer, the term of this patent is extended or adjusted under 35 U.S.C. 154(b) by 350 days.

(21) Appl. No.: 18/329,590

(22) Filed: Jun. 6, 2023

(65) Prior Publication Data

US 2023/0395761 A1 Dec. 7, 2023

(30) Foreign Application Priority Data

Jun. 7, 2022 (TW) .................................. 111121065

(51) Int. Cl.

| *H01L 33/54* | (2010.01) |
| *H10H 20/853* | (2025.01) |
| *H10H 20/854* | (2025.01) |
| *H10W 90/00* | (2026.01) |

(52) U.S. Cl.
CPC ........ *H10H 20/853* (2025.01); *H10H 20/854* (2025.01); *H10W 90/00* (2026.01)

(58) Field of Classification Search
CPC .. H10H 20/853; H10H 20/854; H10H 20/855; H10H 20/84; H01L 25/0753; H01L 25/13; H01L 25/167; G02B 1/10; G02B 5/22; G02B 5/30; G09F 9/33
See application file for complete search history.

(56) References Cited

U.S. PATENT DOCUMENTS

| 11,569,292 B2 | 1/2023 | Han et al. | |
| 2017/0358604 A1* | 12/2017 | Lee ...................... | H10D 86/451 |

| 2020/0292860 A1* | 9/2020 | Chien | ............... G02F 1/133308 |
| 2021/0043807 A1* | 2/2021 | Harris | ................ H10H 20/8512 |
| 2021/0091138 A1 | 3/2021 | Han et al. | |
| 2022/0005406 A1* | 1/2022 | Kuo | ......................... G09G 3/32 |
| 2022/0238768 A1 | 7/2022 | Chien et al. | |
| 2023/0400615 A1* | 12/2023 | Kubo | ....................... G02B 5/20 |

FOREIGN PATENT DOCUMENTS

| CN | 112542480 | 3/2021 |
| CN | 109254451 | 11/2022 |
| KR | 20110113906 | 10/2011 |
| TW | 202230317 | 8/2022 |
| TW | I785960 | 12/2022 |

* cited by examiner

*Primary Examiner* — Elmito Breval

(74) *Attorney, Agent, or Firm* — JCIPRNET

(57) ABSTRACT

A display apparatus including a circuit substrate, a plurality of light-emitting units, an optical film, a first adhesive layer and a second adhesive layer is provided. The light-emitting units are electrically bonded to the circuit substrate. The optical film overlaps the light-emitting units that are disposed between the optical film and the circuit substrate. The optical film includes a light reduction film overlapping a light-emitting surface of the light-emitting units away from the circuit substrate. The first adhesive layer is disposed between the light reduction film and the light-emitting units, and extends into interspaces between the light-emitting units. The second adhesive layer is disposed between the first adhesive layer and the light reduction film. The second adhesive layer has a first portion overlapping the light-emitting units and a second portion overlapping the interspaces. A thickness of the first portion is different from a thickness of the second portion.

16 Claims, 4 Drawing Sheets

163ar ⎫
163ag ⎬ 163A
POL(161A)

163P

160B

163ar ⎫
163ag ⎬ 163A
POL ⎫
     ⎬ 161B
PR  ⎭

163P

160C

DISPLAY APPARATUS

CROSS-REFERENCE TO RELATED APPLICATION

This application claims the priority benefit of Taiwan application serial no. 111121065 filed on Jun. 7, 2022. The entirety of the above-mentioned patent application is hereby incorporated by reference herein and made a part of this specification.

BACKGROUND

Technical Field

The disclosure relates to a display apparatus, and in particular relates to a display apparatus having an optical film.

Description of Related Art

A light-emitting diode panel includes an active element substrate and multiple light-emitting diode elements transposed on the active element substrate. Inheriting the characteristics of light-emitting diodes, light-emitting diode panels are expected to become the mainstream of the next generation of display panels due to their advantages of power saving, high efficiency, high brightness, and fast response time. In order to achieve better light emission efficiency, color uniformity, and reworkability, a packaging method is proposed in which multiple light-emitting diodes are packaged first, and then the packaging structure (e.g., PLCC or SMD) with these light-emitting diodes is adhered or bonded to a printed circuit board. However, the surface flatness and dark state performance of the light-emitting diode panel obtained by this packaging method are relatively poor.

In order to improve the above problems, a method of attaching optical films on these packages is proposed. Since the thickness of the package is much higher than that of a single light-emitting diode, the surface flatness of the adhesive layer covering these packages, in which the adhesive layer is used to connect the optical film, will deteriorate. Therefore, during the attaching process of the optical film, air bubbles are likely to be generated on the connection surface between the optical film and the adhesive layer, thereby affecting the display quality. If the thickness of the adhesive layer is increased, although the problem of bubble generation may be improved, the reliability performance of the LED panel in the high temperature and high humidity environment will deteriorate.

SUMMARY

A display apparatus with good appearance and good reliability in high-temperature and high-humidity environment is provided.

A display apparatus of the disclosure includes a circuit substrate, multiple light-emitting units, an optical film, a first adhesive layer, and a second adhesive layer. The light-emitting units are electrically bonded to the circuit substrate. The optical film overlaps the light-emitting units, and the light-emitting units are disposed between the optical film and the circuit substrate. The optical film includes a light reduction film overlapping a light-emitting surface of the light-emitting units away from the circuit substrate. The first adhesive layer is disposed between the light reduction film and the light-emitting units, and extends into multiple interspaces between the light-emitting units. The second adhesive layer is disposed between the first adhesive layer and the light reduction film, and connects the first adhesive layer. The second adhesive layer has a first portion overlapping the light-emitting units and a second portion overlapping the interspaces. A thickness of the first portion is different from a thickness of the second portion.

Based on the above, in the display apparatus according to an embodiment of the disclosure, the optical film is bonded to multiple light-emitting units on the circuit substrate through the first adhesive layer and the second adhesive layer. The surface of the first adhesive layer covering the light-emitting units is relatively uneven on the side away from the circuit substrate. Through the different thicknesses of the second adhesive layer at different positions corresponding to the first adhesive layer, air bubbles generated between the first adhesive layer and the optical film may be avoided, thereby affecting the appearance of the display apparatus. In addition, through the disposition of the light reduction film, in addition to improving the display contrast of the display apparatus, the selection flexibility of the second adhesive layer may also be increased, so as to effectively improve the reliability of the display apparatus in a high-temperature and high-humidity environment.

DETAILED DESCRIPTION OF DISCLOSED EMBODIMENTS

Figure 1:
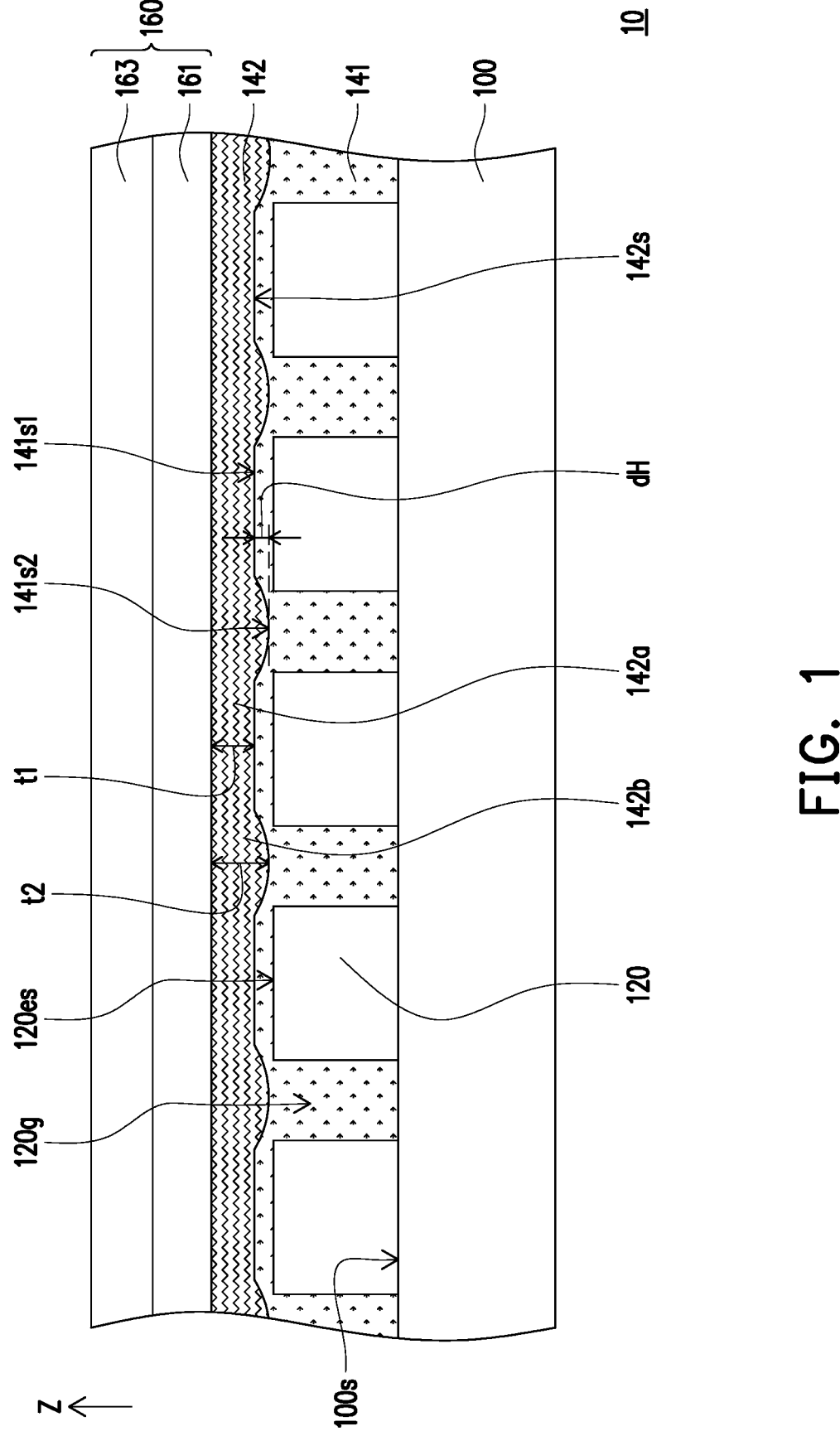
FIG. 1 is a cross-sectional schematic diagram of a display apparatus according to a first embodiment of the disclosure.

The usages of "approximately", "similar to", "essentially" or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, such as being within ±30%, ±20%, ±15%, ±10%, or ±5%. Furthermore, the usages of "approximately", "similar to", "essentially" or "substantially" indicated throughout the specification may refer to a more acceptable deviation scope or standard deviation depending on measurement properties, cutting properties, or other properties, and all properties may not be applied with one standard deviation.

In the drawings, for clarity, the thickness of layers, films, plates, areas, and the like are magnified. It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" may also be used when other elements exist between two elements.

References of the exemplary embodiments of the disclosure are to be made in detail. Examples of the exemplary embodiments are illustrated in the drawings. If applicable, the same reference numerals in the drawings and the descriptions indicate the same or similar parts.

Figures 2A, 2B:
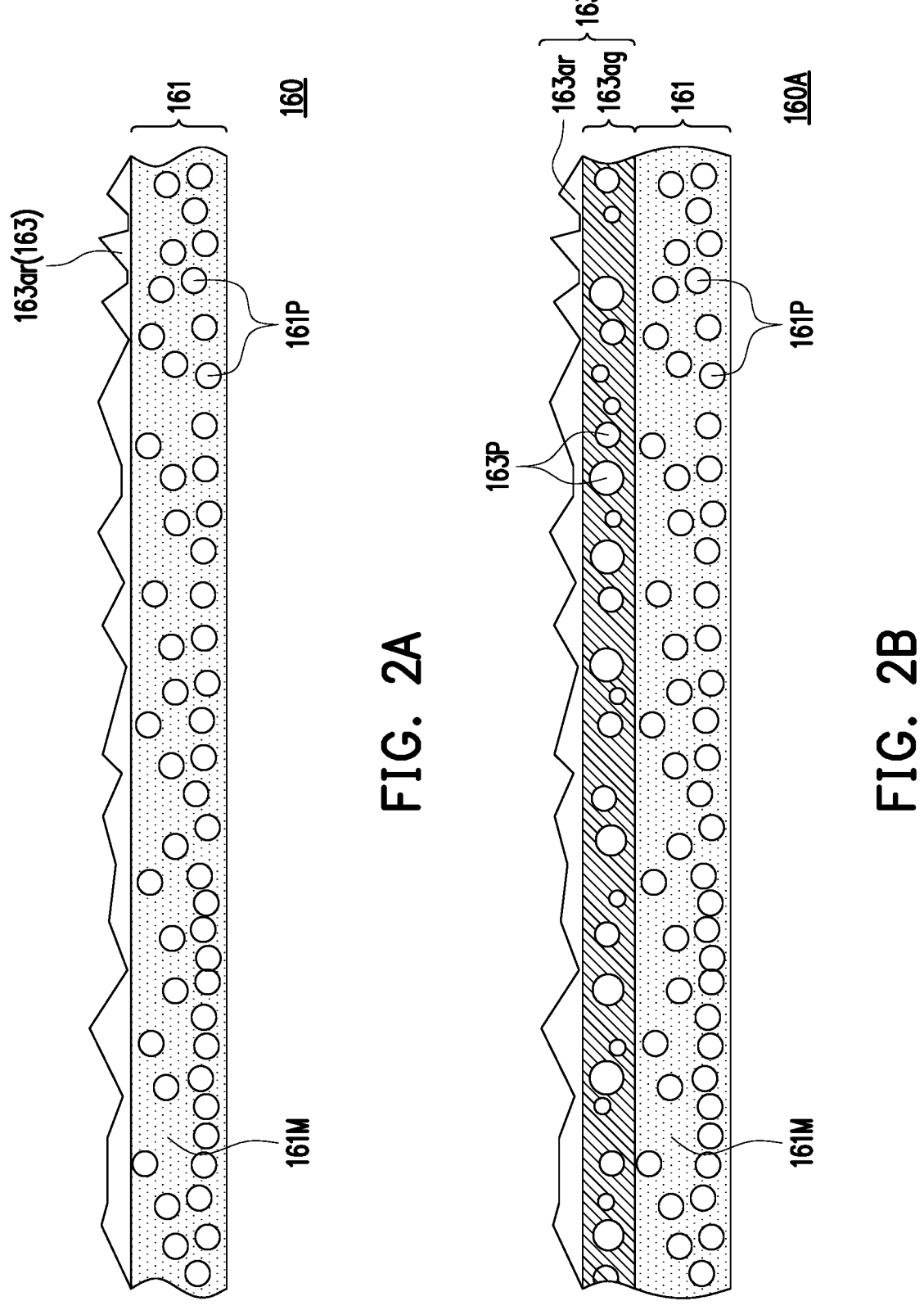
FIG. 2A is an enlarged schematic view of the optical film of FIG. 1.
FIG. 2B to FIG. 2D are cross-sectional schematic diagrams of optical films according to other embodiments of the disclosure.
Figures 2C, 2D:
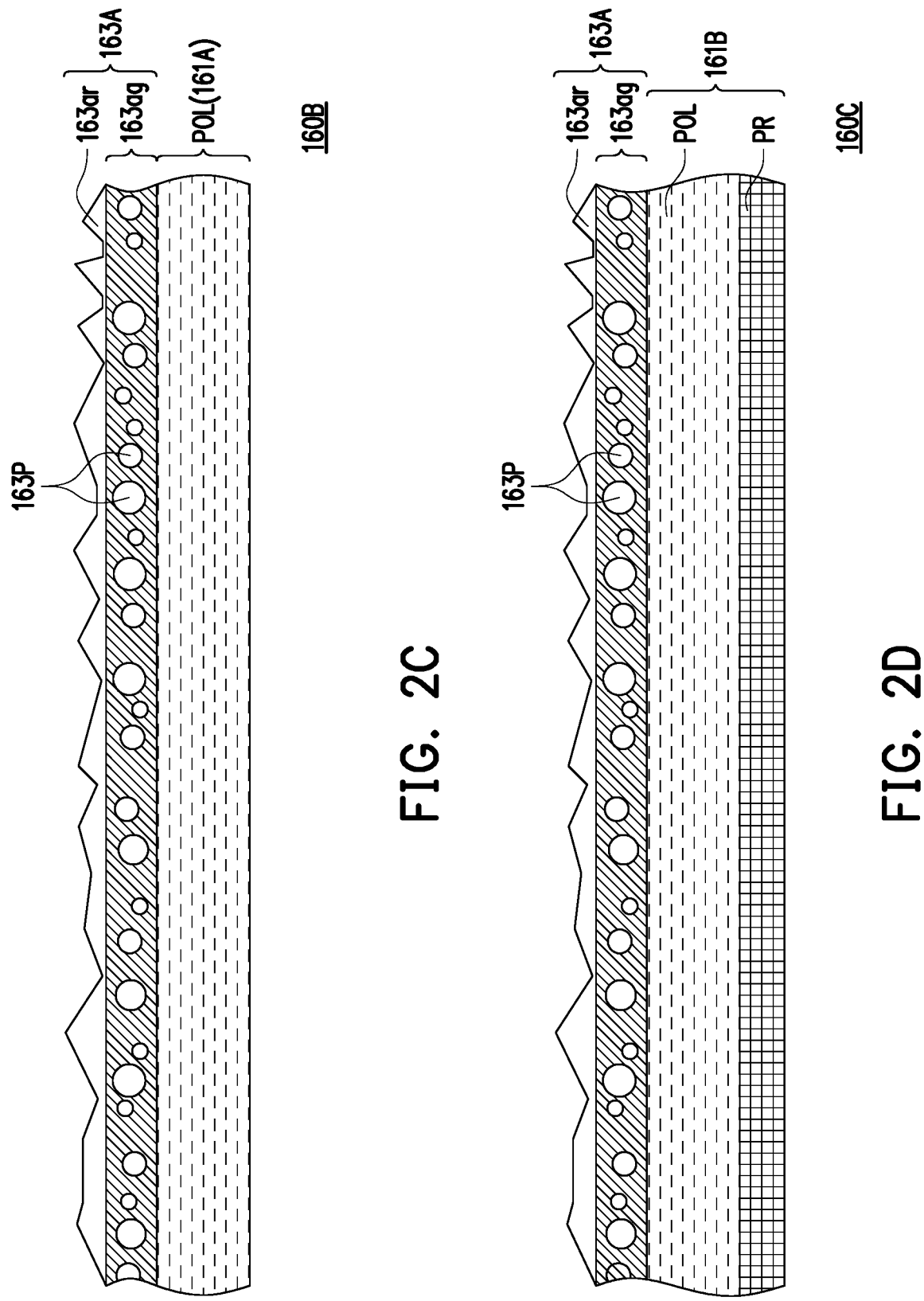

FIG. 1 is a cross-sectional schematic diagram of a display apparatus according to a first embodiment of the disclosure. FIG. 2A is an enlarged schematic view of the optical film of FIG. 1. FIG. 2B to FIG. 2D are cross-sectional schematic diagrams of optical films according to other embodiments of the disclosure.

Referring to FIG. 1 and FIG. 2A, a display apparatus 10 includes a circuit substrate 100, multiple light-emitting units 120, a first adhesive layer 141, a second adhesive layer 142, and an optical film 160. The light-emitting units 120 are dispersedly disposed on the substrate surface 100s of the circuit substrate 100, and are electrically bonded to the circuit substrate 100. For example, the light-emitting units 120 may be arranged in arrays on the circuit substrate 100 along at least two directions, but not limited thereto.

In this embodiment, the circuit substrate 100 is, for example, a printed circuit board (PCB), but not limited thereto. In other embodiments, the circuit substrate 100 may also be a combination of a glass substrate and a pixel circuit layer. The pixel circuit layer is formed on a glass substrate by adopting a semiconductor process, and the pixel circuit layer may include active elements (e.g., thin film transistors) and various signal lines (e.g., data lines, scanning lines, or power lines), but not limited thereto.

The light-emitting unit 120 is, for example, a packaging structure (i.e., a packaged light-emitting element) provided with at least one light-emitting element (not shown), and the packaging structure may be a plastic leaded chip carrier (PLCC) structure, a surface mounted device (SMD), a compression molding packaging structure, or other suitable packaging structures. However, the disclosure is not limited thereto. According to other embodiments not shown, the light-emitting element may be directly bonded on the bonding pad of the circuit substrate 100 and packaged with an encapsulant layer, that is, a chip on board (COB) packaging method.

The aforementioned light-emitting elements are, for example, micro light-emitting diodes (micro LEDs), mini light-emitting diodes (mini LEDs), or light-emitting diodes of other sizes. According to different structural types, the light-emitting element may be a flip-chip type light-emitting diode, a vertical type light-emitting diode, or a lateral type light-emitting diode. For example, the light-emitting units 120 may be provided with multiple light-emitting diodes for emitting light of different colors, such as red light-emitting diodes, green light-emitting diodes, and blue light-emitting diodes. These light-emitting diodes may respectively emit colored light with different light intensities according to the chromaticity or gray scale to be displayed, and achieve the effect of color display by mixing light.

It should be noted that since the connection between the light-emitting unit 120 and the circuit substrate 100 depends on the types of the circuit substrate 100 and the light-emitting unit 120, the drawings of this embodiment only schematically show the connection relationship of the light-emitting unit 120 and the circuit substrate 100. For example, in an embodiment not shown, the circuit substrate 100 may have multiple bonding pads, the light-emitting unit 120 is a flip-chip light-emitting diode, and the light-emitting unit 120 is bonded to two corresponding bonding pads on the circuit substrate 100 through two electrodes located on the same side of the epitaxial structure, but not limited thereto. In another embodiment not shown, the light-emitting unit 120 may also be a vertical type light-emitting diode, and the electrode on the side of the light-emitting unit 120 away from the circuit substrate 100 is electrically connected to the circuit substrate 100 through connecting wires.

In order to improve the visual quality of the display apparatus 10 in the dark state (e.g., dark state contrast), the light-emitting units 120 are provided with an optical film 160 on the side away from the circuit substrate 100, and the optical film 160 is attached to the light-emitting units 120 and the circuit substrate 100 through the first adhesive layer 141 and the second adhesive layer 142. That is, the two adhesive layers are disposed between the optical film 160 and the circuit substrate 100 (or the light-emitting unit 120), and connect the light-emitting units 120 and the optical film 160.

In this embodiment, the first adhesive layer 141 may cover the light-emitting surfaces 120es of multiple light-emitting units 120 facing away from the circuit substrate 100, and extend into multiple interspaces 120g between the light-emitting units 120. For example, when the thickness of the light-emitting unit 120 along a thickness direction (e.g., the direction Z) of the circuit substrate 100 is greater than 300 microns ($\mu$m), the flatness of the surface of the first adhesive layer 141 facing the optical film 160 is poor. For example, the height difference dH of a first surface 141s1 overlapping multiple light-emitting units 120 and a second surface 141s2 overlapping multiple interspaces 120g in the first adhesive layer 141 relative to the substrate surface 100s of the circuit substrate 100 may be greater than 5 microns.

It should be noted that when it is mentioned herein that one component overlaps another component, it refers to the overlapping relationship of the two components along the direction Z. If not specifically mentioned below, the description of the overlapping relationship is defined in the same manner, and is not repeated herein.

Through the disposition of the second adhesive layer 142, air bubbles generating on the connection surface between the first adhesive layer 141 and the optical film 160 during the attaching process of the optical film 160 may be avoided, thereby affecting the appearance and reliability of the display apparatus. Specifically, for the second adhesive layer 142 disposed between the first adhesive layer 141 and the optical film 160, the surface 142s of the second adhesive layer 142 facing the first adhesive layer 141 is coplanar with the first surface 141s1 and the second surface 141s2 of the first adhesive layer 141. That is, the disposition of the second adhesive layer 142 may eliminate the height difference dH between the first surface 141s1 and the second surface 141s2 of the first adhesive layer 141, so as to solve the above-mentioned problem of air bubbles.

From another point of view, the second adhesive layer 142 has a first portion 142a overlapping the light-emitting units 120 and a second portion 142b overlapping the interspaces 120g, and the thickness t1 of the first portion 142a is different from the thickness t2 of the second portion 142b. In this embodiment, the thickness t2 of the second portion 142b of the second adhesive layer 142 is greater than the thickness t1 of the first portion 142a.

The materials of the first adhesive layer 141 and the second adhesive layer 142 may be selected from polyurethane reactive (PUR), epoxy resin, silicone adhesive, poly (methyl methacrylate) based (PMMA-based) polymers, photocurable adhesives (e.g., UV adhesives), or other suitable optical-grade adhesives. The selected materials of the first adhesive layer 141 and the second adhesive layer 142 may be the same or different, which is not limited in the disclosure. In addition, the adhesive material forming the adhesive layer may be cured by heating, lighting, or other physical methods, and the curing reaction may be reversible or irreversible.

It is worth mentioning that the Shore hardness of the first adhesive layer 141 and the second adhesive layer 142 may be between A20 and D80, so as to serve as a buffer layer between the optical film 160 and the light-emitting units 120. For example, when the optical film 160 is impacted or squeezed by an external force, the elastic first adhesive layer 141 and second adhesive layer 142 absorb most of the external force through shrinkage deformation, so as to prevent the light-emitting unit 120 from being damaged under the influence of external force.

In addition, since the hardness of the second adhesive layer 142 is less than the hardness of the first adhesive layer 141, the thermal expansion effect of the second adhesive layer 142 may be effectively reduced, thereby improving the durability and reliability of the display apparatus 10 in a high-temperature and high-humidity environment.

On the other hand, the overlapping of the optical film 160 and the light-emitting units 120 may significantly reduce the overall reflectivity of the display apparatus 10 under ambient light irradiation. In other words, the anti-glare and anti-reflection properties of the display apparatus 10 in a dark state may be effectively improved. Considering process variation, after each light-emitting unit 120 is bonded to the circuit substrate 100, the configuration relationship between its light-emitting surface 120es and the substrate surface 100s of the circuit substrate 100 (e.g., parallel to each other or inclined to each other) is slightly different, resulting in poor surface flatness of the display device on the light-emitting side. Therefore, through the disposition of the optical film 160, the surface flatness of the display apparatus 10 on the side of the display surface (i.e., the side of the light-emitting surface 120es) may also be improved.

In this embodiment, the optical film 160 is, for example, a laminated structure of a light reduction film 161 and a surface treatment layer 163, in which the light reduction film 161 is disposed between the surface treatment layer 163 and the second adhesive layer 142. Referring to FIG. 2A, for example, the surface treatment layer 163 of this embodiment may be an anti-reflection layer 163ar, and the light reduction film 161 may be a spectral absorption filter, but not limited thereto. In detail, the light reduction film 161 may have a film material 161M and multiple light-absorbing particles 161P dispersed in the film material 161M. The light-absorbing particles 161P are adapted to absorb ambient light from the outside. The material of the light-absorbing particles 161P may include carbon black, or masterbatch/dye. The material of the film material 161M includes, for example, poly(methyl methacrylate) (PMMA), polycarbonate (PC), polyethylene terephthalate (PET), cellulose triacetate (TAC), cycloolefin polymer (COP), or glass. Preferably, the transmittance of the light reduction film 161 may be between 20% and 70%.

It should be noted that the light-absorbing particles 161P may have diffusivity, so that the probability of light that hits the light-absorbing particles 161P but is not completely absorbed to collide with other light-absorbing particles 161P increases. Accordingly, the overall light-absorbing capability of the light reduction film 161 may be enhanced. In this embodiment, multiple light-absorbing particles 161P are unevenly distributed in the film material 161M along the thickness direction of the film material 161M. For example, the distribution density of the light-absorbing particles 161P gradually decreases from bottom to top along the vertical direction in FIG. 2A, but not limited thereto. In other embodiments, the light-absorbing particles 161P may also be uniformly dispersed in the film material 161M.

In particular, the disposition of the light reduction film 161 may not only improve the dark state performance or display contrast of the display apparatus 10, but also increase the selection flexibility of the second adhesive layer 142. In this embodiment, the selected material of the second adhesive layer 142 may be a light-transmitting adhesive material with a transmittance greater than 70% after curing and a liquid optical adhesive with a low viscosity coefficient, such as water glue. Therefore, the overall thickness of the second adhesive layer 142 does not need to be too thick to planarize the rough surface on the first adhesive layer 141 (i.e., the combination of the first surface 141s1 and the second surface 141s2), which helps to improve the tolerance and reliability of the display device 10 in a high-humidity and high-temperature environment. For example, the thickness t1 of the first portion 142a of the second adhesive layer 142 may be less than 200 microns.

However, the disclosure is not limited thereto. In another embodiment of FIG. 2B, the surface treatment layer 163A of the optical film 160A may also be an anti-reflection anti-glare layer or an anti-glare low-reflection layer. In detail, the surface treatment layer 163A is, for example, a laminated structure of an anti-glare layer 163ag and an anti-reflection layer 163ar. The anti-glare layer 163ag may include an adhesive material and multiple scattering particles 163P doped in the adhesive material. The adhesive material is, for example, an optical pressure-sensitive adhesive, and the material of the scattering particles 163P includes silicone resin or poly(methyl methacrylate) (PMMA), but not limited thereto. In another variant embodiment not shown, the anti-reflection and anti-glare layer may also be formed of multiple surface microstructures and an anti-reflection film coated on the surface microstructures. In addition, in yet another embodiment not shown, the surface treatment layer may also be formed of a single anti-glare layer 163ag, anti-reflection layer 163ar, or low-reflection layer.

In yet another embodiment of FIG. 2C, the light reduction film 161A of the optical film 160B may be a polarizer POL, and the polarizer POL is, for example, a circular polarizer or a linear polarizer. In yet another embodiment of FIG. 2D, the light reduction film 161B of the optical film 160C may also be a laminated structure of a polarizer POL and a phase retarder PR. That is, the light reduction film of the disclosure may also be a polarized absorption filter, and its transmittance may be between 40% and 60%.

Another embodiments is described below to explain the disclosure in detail, and the same components will be denoted by the same reference numerals, and the description of the same technical content will be omitted. For the description of the omitted part, reference may be made to the above embodiment, and details are not described in the following embodiments.

Figure 3:
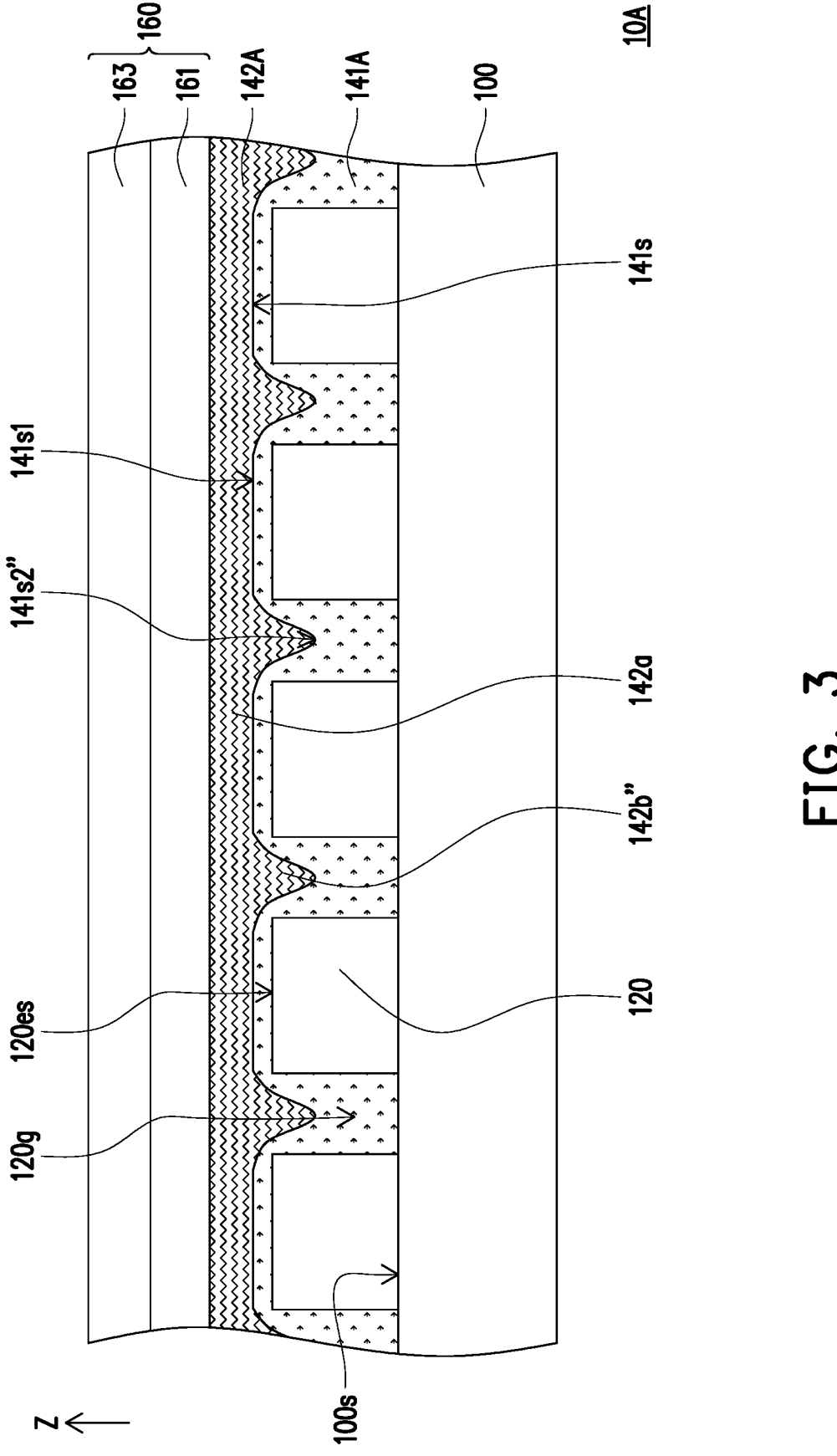
FIG. 3 is a cross-sectional schematic diagram of a display apparatus according to a second embodiment of the disclosure.

FIG. 3 is a cross-sectional schematic diagram of a display apparatus according to a second embodiment of the disclosure. Referring to FIG. 3, different from the display apparatus in FIG. 1, in the display apparatus 10A of this embodiment, the second surface 141s2" of the first adhesive layer 141A is further recessed into the interspaces 120g between the light-emitting units 120. Correspondingly, the second portion 142b" of the second adhesive layer 142A of the display apparatus 10A further extends into the interspaces 120*g* between the light-emitting units 120.

To sum up, in the display apparatus according to an embodiment of the disclosure, the optical film is bonded to multiple light-emitting units on the circuit substrate through the first adhesive layer and the second adhesive layer. The surface of the first adhesive layer covering the light-emitting units is relatively uneven on the side away from the circuit substrate. Through the different thicknesses of the second adhesive layer at different positions corresponding to the first adhesive layer, air bubbles generated between the first adhesive layer and the optical film may be avoided, thereby affecting the appearance of the display apparatus. In addition, through the disposition of the light reduction film, in addition to improving the display contrast of the display apparatus, the selection flexibility of the second adhesive layer may also be increased, so as to effectively improve the reliability of the display apparatus in a high-temperature and high-humidity environment.

What is claimed is:

1. A display apparatus, comprising:
a circuit substrate;
a plurality of light-emitting units, electrically bonded to the circuit substrate;
an optical film, overlapping the light-emitting units, wherein the light-emitting units are disposed between the optical film and the circuit substrate, and the optical film comprises:
a light reduction film, overlapping a light-emitting surface of the light-emitting units away from the circuit substrate;
a first adhesive layer, disposed between the light reduction film and the light-emitting units and extending into a plurality of interspaces between the light-emitting units; and
a second adhesive layer, disposed between the first adhesive layer and the light reduction film, and connecting the first adhesive layer, wherein the second adhesive layer has a first portion overlapping the light-emitting units and a second portion overlapping the interspaces, a thickness of the first portion is different from a thickness of the second portion, the first adhesive layer has a first surface overlapping the light-emitting surface of the light-emitting units and a second surface located between the light-emitting units and not overlapping the light-emitting units, a substrate surface of the circuit substrate is provided with the light-emitting units, and a height of the first surface of the first adhesive layer relative to the substrate surface is higher than a height of the second surface of the first adhesive layer relative to the substrate surface.

2. The display apparatus according to claim 1, wherein the optical film further comprises:
a surface treatment layer, disposed on a side of the light reduction film away from the light-emitting units, and the surface treatment layer is an anti-glare layer, an anti-reflection layer, an anti-glare low-reflection layer, an anti-reflection anti-glare layer, or a low-reflection layer.

3. The display apparatus according to claim 1, wherein the light reduction film is a spectral absorption filter or a polarized absorption filter.

4. The display apparatus according to claim 3, wherein a transmittance of the light reduction film is between 40% and 60%, and the light reduction film is a polarizer or a phase retarder.

5. The display apparatus according to claim 3, wherein a transmittance of the light reduction film is between 20% and 70%, and a material of the light reduction film comprises poly(methyl methacrylate), polycarbonate, polyethylene terephthalate, cellulose triacetate, cycloolefin polymer, or glass.

6. The display apparatus according to claim 5, wherein the light reduction film has a film material and a plurality of light-absorbing particles dispersed in the film material, and the light-absorbing particles are unevenly distributed in the film material along a thickness direction of the film material.

7. The display apparatus according to claim 1, wherein materials of the first adhesive layer and the second adhesive layer is selected from polyurethane reactive, epoxy resin, silicone adhesive, poly(methyl methacrylate) based polymer, or photocurable adhesive.

8. The display apparatus according to claim 1, wherein a transmittance of the second adhesive layer is greater than 70%.

9. The display apparatus according to claim 1, wherein a Shore hardness of the second adhesive layer is between A20 and D80.

10. The display apparatus according to claim 1, wherein a hardness of the second adhesive layer is less than a hardness of the first adhesive layer.

11. The display apparatus according to claim 1, wherein each of the light-emitting units is a packaged light-emitting element.

12. The display apparatus according to claim 11, wherein a thickness of each of the light-emitting units along a thickness direction of the circuit substrate is greater than 300 microns.

13. The display apparatus according to claim 11, wherein the first adhesive layer covers the light-emitting surface of the light-emitting units.

14. The display apparatus according to claim 13, wherein a height difference between the first surface and the second surface relative to the substrate surface is greater than 5 microns.

15. The display apparatus according to claim 1, wherein the thickness of the second portion is greater than the thickness of the first portion of the second adhesive layer.

16. The display apparatus according to claim 15, wherein the thickness of the first portion of the second adhesive layer is less than 200 microns.

* * * * *